(12) United States Patent
Liu et al.

(10) Patent No.: US 11,555,854 B2
(45) Date of Patent: Jan. 17, 2023

(54) DETERMINISTIC STELLAR BUILT-IN SELF TEST

(71) Applicant: Siemens Industry Software Inc., Plano, TX (US)

(72) Inventors: Yingdi Liu, Wilsonville, OR (US); Nilanjan Mukherjee, Wilsonville, OR (US); Janusz Rajski, West Linn, OR (US); Jerzy Tyszer, Poznan (PL)

(73) Assignee: Siemens Industry Software Inc., Plano, TX (US)

( * ) Notice: Subject to any disclaimer, the term of this patent is extended or adjusted under 35 U.S.C. 154(b) by 111 days.

(21) Appl. No.: 16/982,241

(22) PCT Filed: Mar. 21, 2019

(86) PCT No.: PCT/US2019/023278
§ 371 (c)(1),
(2) Date: Sep. 18, 2020

(87) PCT Pub. No.: WO2019/183296
PCT Pub. Date: Sep. 26, 2019

(65) Prior Publication Data
US 2021/0373077 A1     Dec. 2, 2021

Related U.S. Application Data

(60) Provisional application No. 62/646,494, filed on Mar. 22, 2018.

(51) Int. Cl.
*G01R 31/3185*     (2006.01)
*G01R 31/3181*     (2006.01)
(Continued)

(52) U.S. Cl.
CPC . *G01R 31/318536* (2013.01); *G01R 31/3177* (2013.01); *G01R 31/31813* (2013.01);
(Continued)

(58) Field of Classification Search
CPC ........ G01R 31/318536; G01R 31/3177; G01R 31/31813; G01R 31/318307;
(Continued)

(56) References Cited

U.S. PATENT DOCUMENTS 6,061,818 A     5/2000  Touba et al.
7,478,296 B2 *  1/2009  Rajski ............ G01R 31/318335
                                                      714/726
(Continued)

FOREIGN PATENT DOCUMENTS

WO     2010/102228 A1     9/2010

OTHER PUBLICATIONS

PCT International Search Report and Written Opinion of International Searching Authority dated May 30, 2019 corresponding to PCT International Application No. PCT/US2019/023278 filed Mar. 21, 2019.

(Continued)

*Primary Examiner* — Nghia M Doan

(57) ABSTRACT

A system for testing a circuit comprises scan chains, a controller configured to generate a bit-inverting signal based on child test pattern information, and bit-inverting circuitry coupled to the controller and configured to invert bits of a parent test pattern associated with a plurality of shift clock cycles based on the bit-inverting signal to generate a child test pattern during a shift operation. Here, the plurality of shift clock cycles for bit inverting occur every m shift clock cycles, and the child test pattern information comprises information of m and location of the plurality of shift clock cycles in the shift operation.

18 Claims, 10 Drawing Sheets

(51) Int. Cl.
*G01R 31/3177* (2006.01)
*G01R 31/3183* (2006.01)
(52) U.S. Cl.
CPC ........... *G01R 31/318307* (2013.01); *G01R 31/318371* (2013.01); *G01R 31/318385* (2013.01)
(58) Field of Classification Search
CPC .... G01R 31/318371; G01R 31/318385; G01R 31/318547; G01R 31/318555
See application file for complete search history.

(56) References Cited

U.S. PATENT DOCUMENTS

| | | |
|---|---|---|
| 7,493,540 B1 | 2/2009 | Rajski et al. |
| 9,599,673 B2 | 3/2017 | Jindal et al. |
| 2002/0035708 A1 | 3/2002 | Ishida et al. |
| 2005/0204232 A1* | 9/2005 | Seuring ........... G01R 31/318544 714/733 |
| 2008/0189583 A1 | 8/2008 | Anderson et al. |
| 2008/0195346 A1 | 8/2008 | Lin et al. |
| 2008/0195907 A1 | 8/2008 | Wittke et al. |
| 2014/0095101 A1 | 4/2014 | Gizdarski |
| 2015/0006987 A1 | 1/2015 | Narayanan et al. |
| 2016/0003907 A1* | 1/2016 | Rasjki ............ G01R 31/318547 714/738 |
| 2016/0245863 A1* | 8/2016 | Mrugalski ...... G01R 31/318547 |

OTHER PUBLICATIONS

K.-H. Tsai, J. Rajski, and M. Marek-Sadowska, "Star test: the theory and its applications," IEEE Trans. CAD, vol. 19, No. 9, pp. 1052-1064, Sep. 2000.

G. Mrugalski, J. Rajski, J. Solecki, Ł. Rybak, and J. Tyszer, "Star-EDT: Deterministic on-chip scheme using compressed test patterns," IEEE Trans. CAD, vol. 36, No. 4, Apr. 2017, pp. 683-693.

* cited by examiner while fault list $f$ is not empty do generate a given number of parent patterns produce all children patterns fault dropping simulate the current test clusters on $f$ save effective patterns update $f$ by removing detected faults run pattern reordering and save effective patterns

FIG. 8

| | Gates | Scan cells | Scan chains | EDT size |
|---|---|---|---|---|
| D1 | 1.19M | 72K | 400 | 4, 4 |
| D2 | 2.07M | 148K | 400 | 4, 4 |
| D3 | 3.32M | 326K | 400 | 4, 4 |
| D4 | 1.68M | 86K | 400 | 4, 4 |
| D5 | 1.04M | 57K | 400 | 4, 4 |
| D6 | 1.38M | 93K | 168 | 10, 10 |
| D7 | 2.53M | 206K | 370 | 10, 10 |
| D8 | 4.83M | 326K | 598 | 10, 10 |
| D9 | 4.04M | 200K | 364 | 10, 10 |
| D10 | 2.59M | 154K | 1200 | 12, 12 |
| D11 | 2.29M | 252K | 490 | 4, 4 |
| D12 | 1.53M | 75K | 273 | 3, 3 |

FIG. 9

DETERMINISTIC STELLAR BUILT-IN SELF TEST

RELATED APPLICATIONS

This application claims the benefit of U.S. Provisional Patent Application No. 62/646,494, filed on Mar. 22, 2018, titled "Deterministic Stellar Built-In Self-Test," and naming Yingdi Liu et al. as inventors, which application is incorporated entirely herein by reference.

FIELD OF THE DISCLOSED TECHNIQUES

The presently disclosed techniques relates to circuit testing. Various implementations of the disclosed techniques may be particularly useful for in-system testing.

BACKGROUND OF THE DISCLOSED TECHNIQUES

Behind the rapid development of advanced driver assistance systems (ADAS) and self-driving vehicles is massive processing of sensors-generated data. This trend, in turn, fuels the flourishing automotive electronics market where more advanced technology nodes are being introduced at an accelerated rate. With the fast-growing number of complex safety-critical components, integrated circuits (ICs) in this area must adhere to the most stringent requirements for high quality and long-term reliability driven by functional safety standards such as ISO 26262 and its Automotive Safety Integrity Level D (ASIL D) targets. In addition to the high quality of manufacturing test, an ASIL D compliance for automotive ICs requires advanced and complementary test solutions to address the challenges posed by automotive parts and to support one or more of the following test requirements: (1) the ability to run in-system tests during functional operations, (2) short test application times due to strict limits on key-on, key-off, and especially idle times deployed for periodic on-line tests, (3) low test power, (4) low silicon area, (5) the ability to deal with defect sensitivities unknown at the time of IC manufacturing, and (6) the potential to scale up easily.

Logic built-in self-test (LBIST) is more and more often used with on-chip test compression to keep up with demands of new technologies for a viable in-system test alternative. LBIST typically employs scan as its operational baseline to run high quality at-speed power-aware tests and uses simple external devices to provide power and clock signals. With the mass market driving safety critical systems, the concept of combining LBIST and test data compression has allowed several test schemes to rival conventional manufacturing test techniques. High test coverage attainable in a very short period of time, including system level and in-field test procedures, has already become crucial for efficient and reliable operations of devices destined for long-term deployment. However, new more complex defects and reliability risks inevitably pose the questions of how sustainable the current test schemes are, and what design-for-test methods may soon be needed.

Some conventional LBIST schemes use weighted random patterns to deal with unacceptably low fault coverage numbers given a feasible pattern count. Alternatively, desired stimuli could be obtained by perturbing pseudorandom vectors. The bit-flipping and its applications may serve here as examples. Unfortunately, these schemes are heavily dependent on target test sets and have to be substantially resynthesized every time test patterns changed due to logic Engineering Change Orders (ECO). Other aspects of LBIST functionality need to be worked out, too. For example, an LBIST scheme should be less vulnerable to unknown states, or should produce low power test patterns in a programmable fashion. Relevant conventional solutions, however, still handle primarily pseudorandom test data. With these test patterns, it becomes increasingly difficult to achieve desired test quality when targeting advanced fault models. In addition, random pattern resistant failures routinely need insertion of test points to improve test coverage.

As noted previously, the hybrid BIST schemes can overcome the bottleneck of test data bandwidth. In a hybrid BIST scheme, deterministic top-up patterns (used to detect random-resistant faults) is stored on a tester in a compressed form, and then the existing BIST infrastructure can be used to perform a vector decompression. The underlying encoding scheme typically takes advantage of test cubes' low fill rates. Solutions in this class include linear-feedback shift register LFSR coding, static and dynamic LFSR reseeding.

Techniques based on perturbing pseudorandom test patterns can be replaced with the use of clusters of patterns comprising a deterministic parent vector and its random or deterministic derivatives. For example, bits of parent test patterns generated by ATPG can be selectively flipped. One conventional scheme requires complex test logic that makes use of scan order, polarity between the neighboring scan cells, control points inserted between them, and a waveform generator. With these features the scan chains behave like a ROM capable of encoding several deterministic test vectors. In another scheme, a fully deterministic test compression uses both the EDT-based compression and deterministic inversion of decompressed test patterns. While the storage size for parent patterns in this scheme is low, the number of child patterns required to achieve a certain test coverage is considerably high. A new method that uses not too complex logic and offers a flexible trade-off between test application time and parent test data volume is highly desirable.

BRIEF SUMMARY OF THE DISCLOSED TECHNIQUES

Various aspects of the disclosed technology relate to deterministic Stellar Built-In Self-Test techniques. In one aspect, there is a system for testing a circuit, comprising: scan chains comprising scan cells, the scan chains configured, in a test mode, to shift in test patterns, apply the test patterns to the circuit, capture test responses of the circuit, and shift out the test responses; a controller comprising storage circuitry, the controller configured to generate a bit-inverting signal based on child test pattern information stored in the storage circuitry; and bit-inverting circuitry coupled to the controller, the bit-inverting circuitry configured to invert bits of a parent test pattern associated with a plurality of shift clock cycles based on the bit-inverting signal to generate a child test pattern during a shift operation, wherein the plurality of shift clock cycles for bit inverting occur every m shift clock cycles, and the child test pattern information comprises information of m and location of the plurality of shift clock cycles in the shift operation.

m may be the same for all of child patterns for all of parent test patterns of a test set. The parent test pattern and the location of the plurality of shift clock cycles in the shift operation may be determined by a test pattern generation software tool, and the test pattern generation software tool performs a pattern generation process comprising: performing a circuit structural analysis first to identify supergates, running an automatic test pattern generation (ATPG) process using the supergates to determine parent test patterns, and generating child test patterns for the parent test patterns. The pattern generation process may further comprise: performing pattern reordering, and saving effective child test patterns.

The system may further comprise: test pattern decompressing circuitry, test pattern decompressing circuitry configured to decompress compressed parent test pattern into the parent test pattern. The inverting bits may be performed in the test pattern decompressing circuitry. The test pattern decompressing circuitry may comprise a ring generator and a phase shifter. The inverting bits may be performed by XOR gates inserted between the ring generator and the phase shifter.

The storage circuitry may comprise a first register for storing information of m and a second register for storing information of the location of the plurality of shift clock cycles in the shift operation. The controller may further comprise a down counter, the down counter being coupled to outputs of the second register, and the bit-inverting signal may be generated based on combining outputs of the down counter and outputs of the first register.

In another aspect, there are one or more non-transitory computer-readable media storing computer-executable instructions for causing one or more processors to perform a method, the method comprising: creating the above system in a circuit design for testing a circuit fabricated according to the circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 8 illustrates an example of an algorithm for generating parent test patterns and their child test patterns according to some embodiments of the disclosed technology.

FIG. 9 illustrates basic data regarding ten industry designs.

DETAILED DESCRIPTION OF THE DISCLOSED TECHNIQUES

General Considerations

Various aspects of the disclosed technology relate to deterministic Stellar Built-In Self-Test techniques. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "generate" and "invert" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
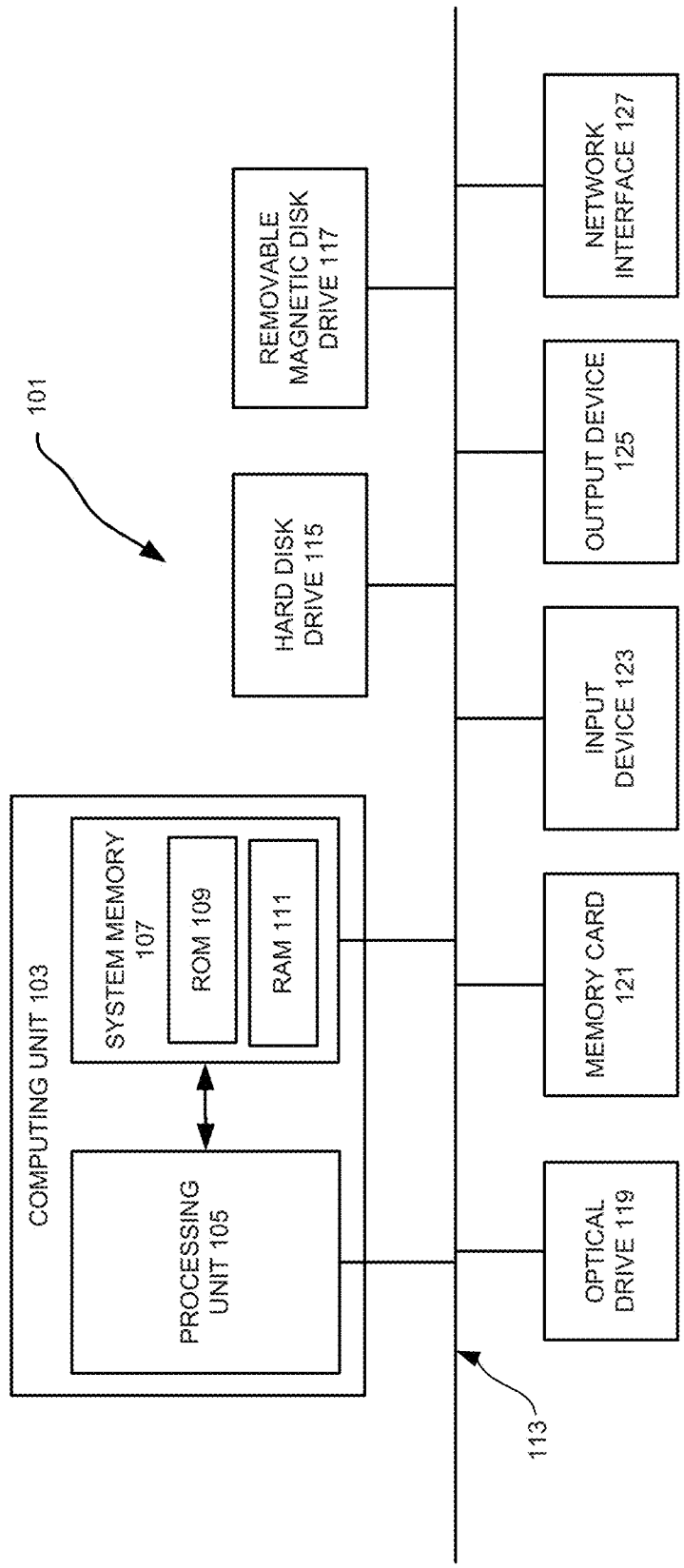
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design For Test, Test Pattern Generation, Testing And Diagnosis

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

The embedded deterministic test (EDT) is one example of test compression techniques.

The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-random pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Deterministic Two-Level Compression For In-System Testing

Figure 2:
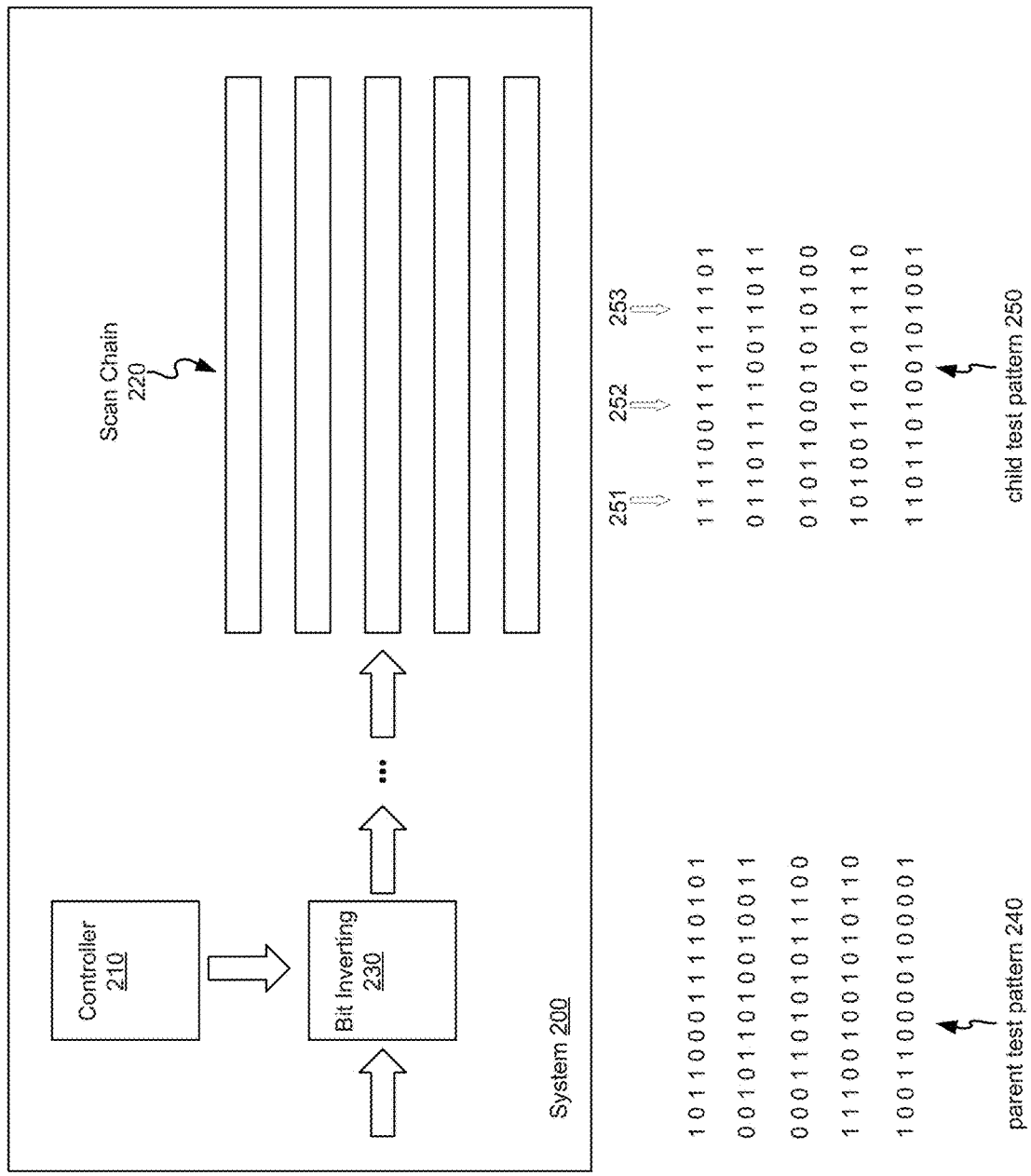
FIG. 2 illustrates an example of a system for testing a circuit according to various embodiments of the disclosed technology.

FIG. 2 illustrates an example of a system 200 for testing a circuit according to various embodiments of the disclosed technology. The system 200 comprises a bit-inverting controller 210, scan chains 220, and bit-inverting circuitry 230. The scan chains 220, comprising scan cells, are configured in a test mode to shift in test patterns, apply the test patterns to the circuit, capture test responses of the circuit, and shift out the test responses. The bit-inverting controller 210 comprises storage circuitry and is configured to generate a bit-inverting signal based on child test pattern information stored in the storage circuitry. The storage circuitry can comprise memory circuitry, register circuitry, or both. The register circuitry can be formed by flip-flops. Coupled to the bit-inverting controller 210, the bit-inverting circuitry 230 is configured to invert bits of a parent test pattern associated with a plurality of shift clock cycles based on the bit-inverting signal to generate a child test pattern during a shift operation. Here, the plurality of shift clock cycles for bit inverting occur every m shift clock cycles. Accordingly, m represents a distance between successive bit-inverting time frames. The child test pattern information comprises information of m and location of the plurality of shift clock cycles in the shift operation.

Also shown in FIG. 2 is an example of a pair of a parent test pattern 240 and a child test pattern 250. While the parent test pattern 240 is shifted into the scan chains 220, the bits associated with the shift clock cycles 251, 252 and 253 are inverted (sometimes also referred to as "flipped" or "complemented") individually. As a result, the child test pattern 250, rather than the parent test pattern 240, is loaded into the scan chains 220 after the shift operation. In this example, the first bit-inverting clock cycle corresponds to the fourth shift clock cycle counting from the right end, and the bit-inverting clock cycles happen every five shift clock cycles (m=5).

Figure 3:
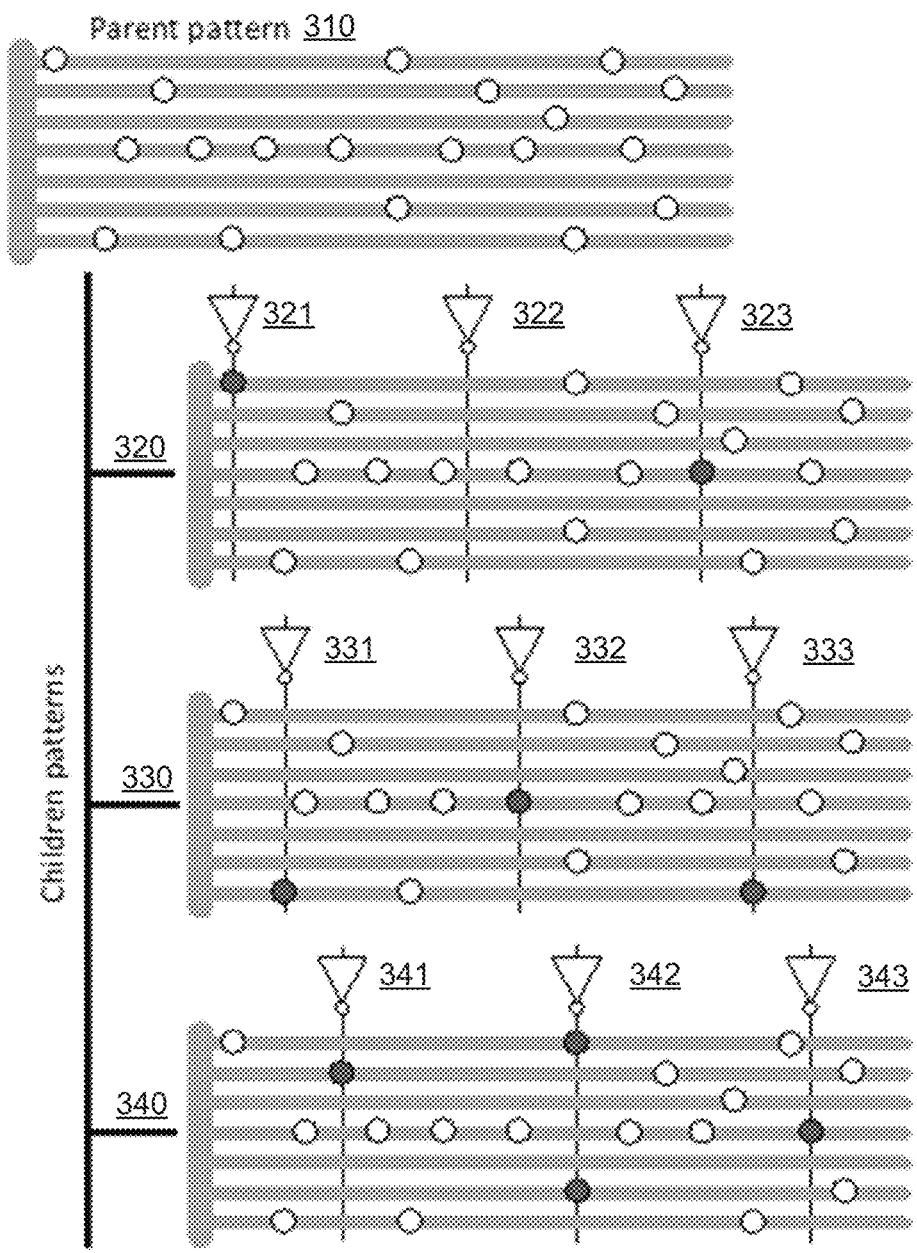
FIG. 3 illustrates an example of scan chains loaded with a parent test pattern and its several child test patterns.

FIG. 3 illustrates an example of scan chains loaded with a parent test pattern 310 and its child test patterns 320, 330, 340 . . . . The child pattern 320 differs from the parent test pattern 310 at bit-inverting time frames (bit-inverting shift clock cycles) 321, 322 and 323; the child pattern 330 differs from the parent test pattern 310 at bit-inverting time frames 331, 332 and 333; and the child pattern 340 differs from the parent test pattern 310 at bit-inverting time frames 341, 342 and 343. These bit-inverting time frames are equally spaced. Their start locations can be consecutive, equally-spaced, or unequally-spaced. As will be discussed in detail below, the start position can be determined during test pattern generation. With some implementations of the disclosed technology, the spacing between the bit-inverting time frames within each of the child test patterns is the same for all of the child test patterns of the parent test pattern 310. The spacing may also be the same for all of child test patterns of all parent test patterns in a test set. The spacing between the bit-inverting time frames for different test sets may be set to be the same or different. Small circles in the figure, filled and unfilled, represent specified bits—values of bits are specified for detecting targeted faults either individually or in a certain combination. By flipping bits associated with certain time frames, the derived child test pattern can detect faults undetectable by the parent test pattern.

Figure 4:
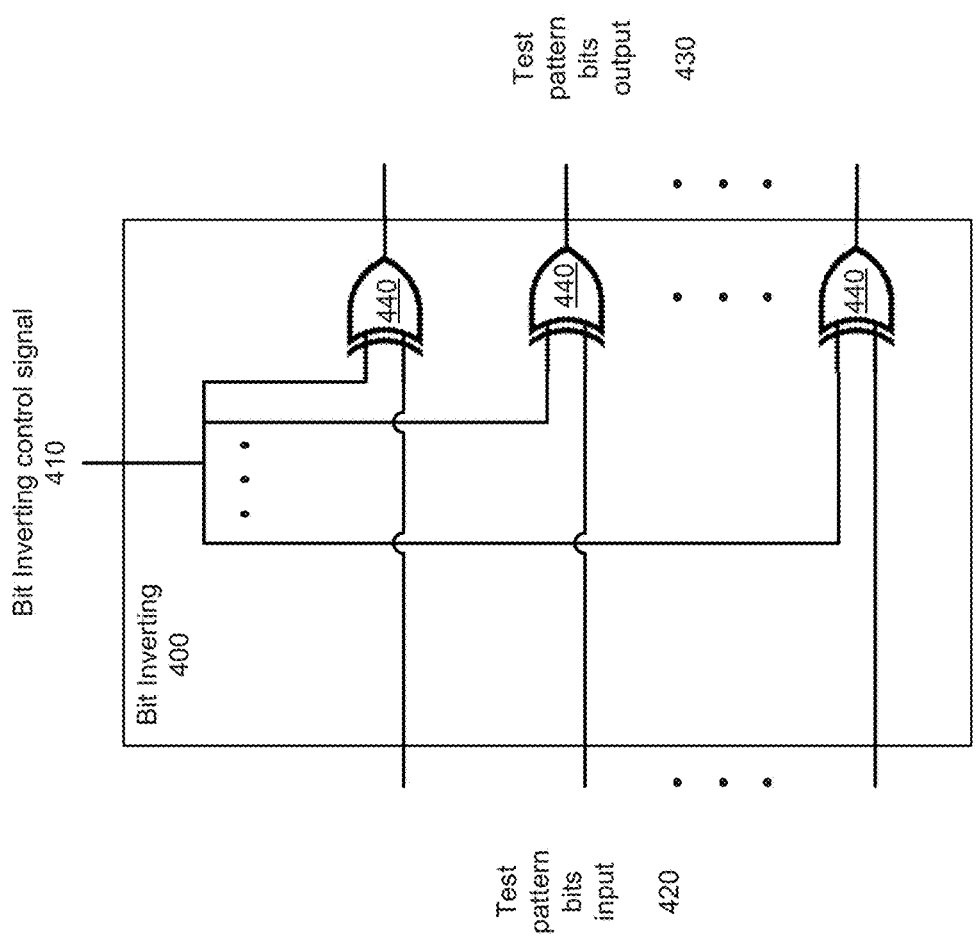
FIG. 4 illustrates an example of a block diagram of the bit-inverting circuitry which may be implemented according to various examples of the disclosed technology.

FIG. 4 illustrates an example of a block diagram of the bit-inverting circuitry 400 which may be implemented according to various examples of the disclosed technology. The bit-inverting circuitry 400 comprises a series of Exclusive OR (XOR) gates 440. Each of the XOR gates 440 can invert one test pattern bit from test pattern bits input 420 based on a bit inverting control signal 410. If the bit inverting control signal 410 is set to be "0", test pattern bits will pass through the XOR gates 440 without change. If the bit inverting control signal 410 is set to be "1", test pattern bits will be inverted (from "0" to "1" or from "1" to "0") by the XOR gates 440. The outputs of the XOR gates are coupled to test pattern bits output 430 of the bit-inverting circuitry 400. It should be appreciated by a person of ordinary skill in the art that the bit-inverting circuitry 400 is just an example of the bit inverting circuitry 230 and that different circuits can be used to implement the bit inverting circuitry 230.

Figure 5:
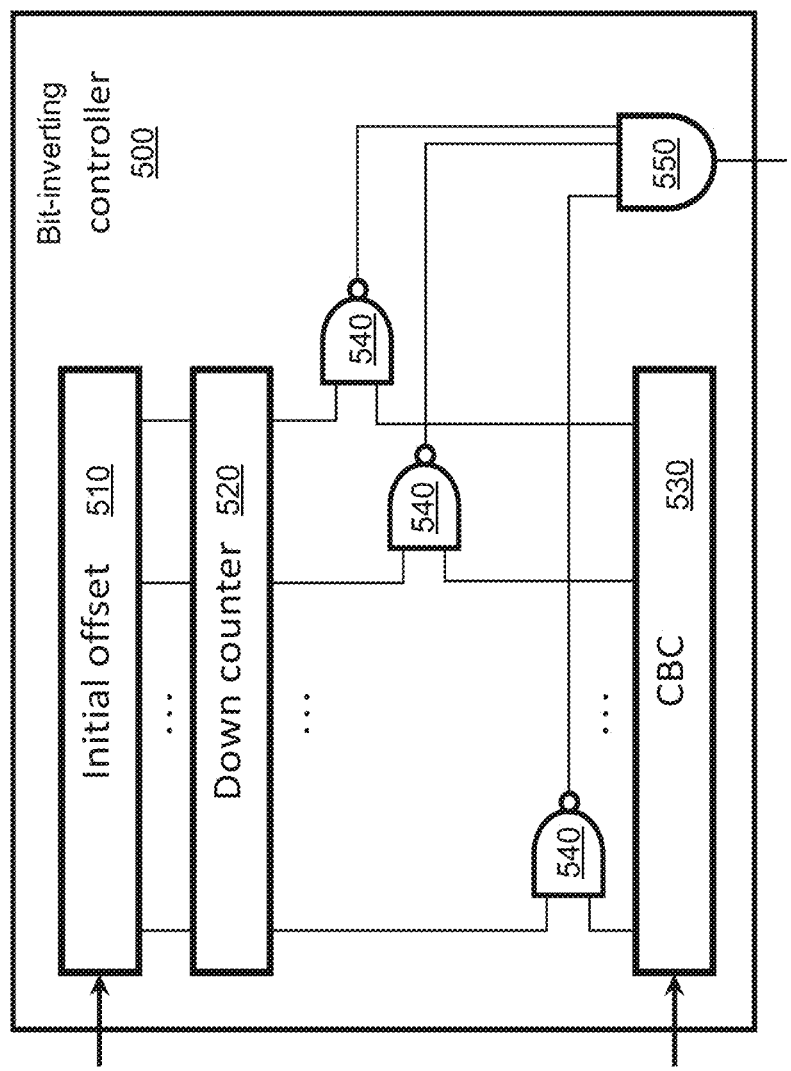
FIG. 5 illustrates an example of a block diagram of a bit-inverting controller which may be implemented according to various examples of the disclosed technology.

FIG. 5 illustrates an example of a block diagram of a bit-inverting controller 500 which may be implemented according to various examples of the disclosed technology. The bit-inverting controller 500 comprises an initial offset register 510, a down counter 520, a clock-between-complements (CBC) register 530, a series of NAND gates 540, and an AND gate 550. The CBC register 530 stores a clock-between-complements (CBC) vector which defines a distance m between successive time frames (shift clock cycles) being complemented (inverted/flipped). The content of the CBC register 530 is used to gate the down counter 520 through the NAND gates 540. Here, m is binary-coded as $2^d-1$, where $d=\log_2 m$. Assume, for example, that the CBC register 530 is a 9-bit register and that the bit-inverting is performed every 16 shift clock cycles (m=16). The vector stored in the CBC register 530 will be 000001111 ($d=\log_2 16=4$, $2^d-1=15$). Only when each of the last four digits of the down counter 520 becomes "0" can each of the NAND gates 540 output a "1", which means the AND gate 550 outputs "1" every 16 shift clock cycles.

As noted previously, a parent test pattern can have multiple child test patterns with the bit-inverting starting at different shift clock cycles. These different starting points (initial offset values) can be encoded with a binary child selection vector. If four child test patterns have their initial bit-inverting time frames at 1, 4, 5, and 10, respectively, then the child selection vector can be represented as 0000010000110010, i.e., with bits $b_1$, $b_4$, $b_5$, and $b_{10}$ asserted (the least significant bit is on the right-hand side). The initial offset register 510 is uploaded based on the content of the child selection vector in such a way that if bit b of this vector is asserted, b=0, 1, . . . , k−1, then the register gets the binary-coded value of b. The initial offset is subsequently used to initialize the down counter 520 which works synchronously with the scan shift clock. By observing the counter and detecting the all-0 sequence on its least significant d bits, one can decide when to yield the bit-inverting signal. For n-bit registers, as discussed previously, this is achieved by n NAND gates 540 whose outputs' product is finally delivered by an n-input AND gate 550.

Figure 6:
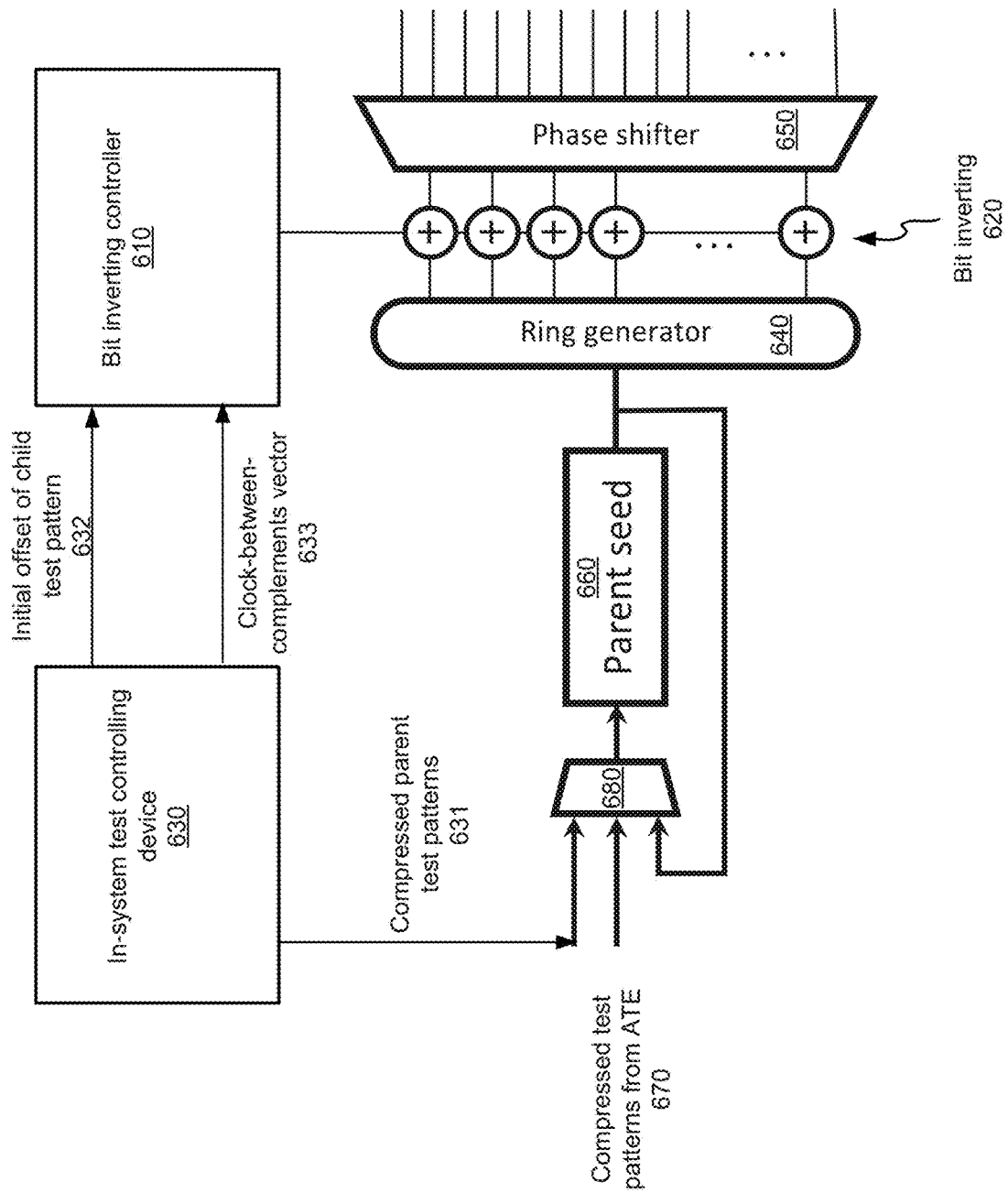
FIG. 6 illustrates an example of a detailed built-in self-test architecture according to some embodiments of the disclosed technology.

FIG. 6 illustrates an example of a detailed built-in self-test architecture according to some embodiments of the disclosed technology. This architecture has a decompressor compressing a ring generator 640 and a phase shifter 650. The decompressor can decompress a compressed test pattern into a test pattern. Between the ring generator 640 and the phase shifter 650 is bit inverting circuitry 620 configured to complement bits at certain shift clock cycles based on a bit-inverting signal generated by a bit-inverting controller 610. The bit-inverting controller 610 receives both a signal for initial offset of child test pattern 632 and a clock-between-complements vector 633 from an in-system test controlling device 630. In addition to the above two signals, the in-system test controlling device 630 also supplies compressed parent test patterns 631 to a parent seed register 660 through a multiplexer 680. The multiplexer 680 selects either compressed parent test patterns 631 from either the in-system test controlling device 630, or a recycled compressed test pattern from the parent seed register 660, or compressed parent test patterns 670 from ATE. The first one or two are for in-system testing while the last one or two are for manufacture testing.

In an in-system test according to some embodiments of the disclosed technology, the application of a single pattern cluster may proceed as follows. After applying the original parent pattern (with the complement signal disabled) and setting up a CBC register in the bit-inverting controller 610 whose bits indicate which part of the down counter is taken into account, a processor in the in-system test controlling device 630 attempts to load an initial offset register in the bit-inverting controller 610, which is subsequently used to initialize a down counter also in the bit-inverting controller 610. Let the offset be set to 3. A very few first states of the counter will be, therefore, the following: 3, 2, 1, 0 (here the complement signal is going to be asserted), $2^n-1$, $2^n-2$, and so forth. Once the least significant d bits become the all-0 vector again, the next complement signal is delivered. Note that all complements are phase-shifted with respect to the first scan shift clock pulse by 3 cycles in this case. Once the entire child pattern is applied, the initial offset register is reloaded with a phase shift corresponding to the next valuable child pattern, and the process repeats with the parent pattern seed circulating within the parent seed register until all desired child patterns are generated. This is now time to apply the next parent pattern with no complements, and then its derivatives, as described above. The former is doable through a combination of reloading the parent seed register and disabling the complement wire driven by the AND gate.

In FIG. 6, parent test patterns are stored on-chip in a compressed form, requiring less storage space than in an uncompressed form. Moreover, each parent test pattern can generate multiple child test patterns. The initial offsets of all child test patterns for one parent test pattern can be coded, for example, by a single child selection vector as discussed above. This further reduces usage of test data memories. Because of this additional test compression, various implementations of the disclosed technology are sometimes referred to as deterministic two-level compression.

It should be noted that the in-system test controlling device 630 does not have to include a processor and that a simple logic circuit can perform the function. It should also be noted that, while the bit-inverting controller 610 and the in-system test controlling device 630 are shown as separate units in FIG. 6, a single on-chip device can be used to implement both of the units.

Figure 7:
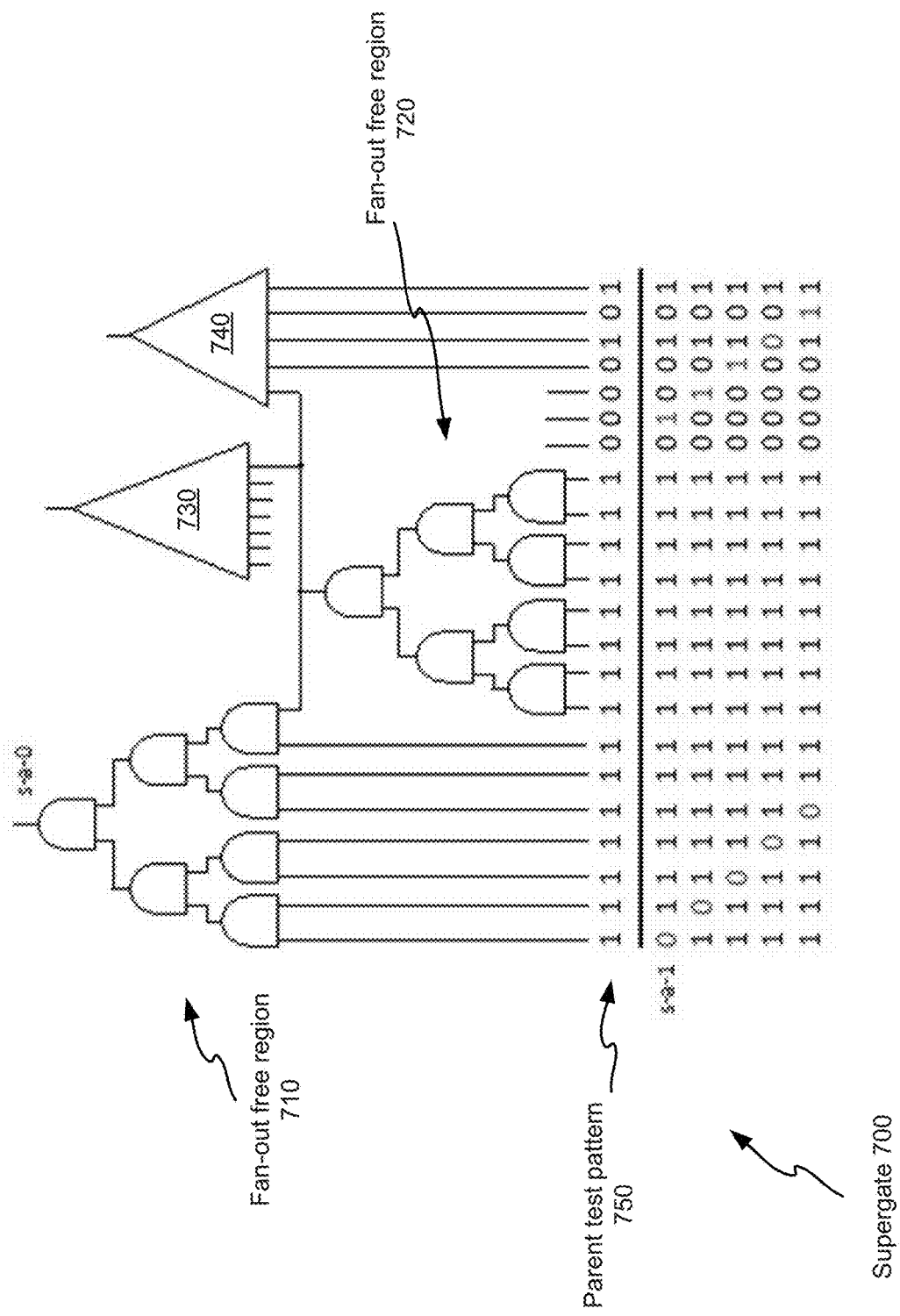
FIG. 7 illustrates an example of a supergate formed by two fan-out free regions made of AND gates.

As a deterministic test approach, parent test patterns along with their child test patterns need to be determined using a software tool. According to various embodiments of the disclosed technology, the software tool may perform a circuit structural analysis first to identify supergates. Supergates have tree-like structures comprising a homogenous type of gates and fan-out free regions (FFRs) they belong to. FIG. 7 illustrates an example of a supergate 700. The supergate 700 has two fan-out free regions 710 and 720 made of AND gates. Also shown in the figure are two logics 730 and 740 receiving the output of the fan-out free regions 720. A parent test pattern 750 sets all inputs of the supergate 700 to "1", which can detect stuck-at-0 fault on the output of the supergate 700. By complementing its bits $b_0$, $b_{16}$, . . . , then bits $b_1$, $b_{17}$, . . . , and so on, a plurality of child test patterns can be derived. These child test patterns can detect all stuck-at-1 faults at the inputs of the supergate 700. Thus, a cluster consisting of a parent pattern and systematically-derived children vectors can detect many related faults of a supergate.

Next, SCOAP (Scandia Controllability/Observability Analysis Program) testability measures can be computed and recorded. A complete set of deterministic test patterns is subsequently created by running ATPG. This step is essentially a framework that produces and verifies successive parent patterns and their derivatives iteratively, a given number of parents at a time. Typically, a single and compressible parent pattern is going to be a result of merging of ATPG-produced test cubes obtained for properly selected faults. The fault selection procedure picks randomly a fault f from the entire fault list. Usually, however, f does not become the direct ATPG target. Rather than f a fault at the output of a supergate that hosts f is selected, instead. This way there are better chances to get the most suitable parent pattern that can be subsequently deployed to yield derivative test patterns detecting all target faults within a supergate or the corresponding FFR. Moreover, the SCOAP values can also be used to guide the selection process by choosing a fault with the highest sum of controllability and observability metrics within FFR hosting f Now, every ATPG-produced stimulus becomes a kernel of a test cluster comprising also its children patterns obtained due to multiple complements of the parent pattern by using a user-defined period between successive complements.

Once a given number of parent test patterns are generated, the corresponding test clusters can now be individually fault simulated with the fault dropping enabled. Note that this process is significantly less CPU-intensive than some conventional approaches since derived patterns are fairly restrained and their number can easily be controlled by a user. Moreover, every cluster can be further revised in such a way that only effective child patterns, i.e., those that detect some faults, are retained. As a result, every parent pattern is now assigned a binary-coded child selection vector, and the parent pattern seeds are recorded. The procedure presented above is repeated until the complete test coverage is reached.

To further reduce the total number of test patterns, a pattern reordering procedure can be applied to all effective patterns, both parents and children, obtained in the previous steps. These test patterns may be first sorted in the descending order with respect to the number of faults they detect. In the steps to follow, a fault dropping simulation repeatedly determines faults detected by successive patterns, beginning with a test pattern that features the largest fault detection count. Therefore, this phase basically implements a reverse order fault simulation that reveals faults not yet detected by the previously examined patterns. It also updates child selection vectors for those clusters whose members were removed. It is worth noting that the entire test clusters may be deleted during this phase, if none of their patterns, including the parent, detect any new faults after reordering the test vectors. The presented algorithm produces virtually a minimal set of test clusters that allow one to flexibly trade-off test coverage, test application time, and the size of the on-chip test memories. The algorithm can be summarized as illustrated in FIG. 8.

Some embodiments of the disclosed technology have been tested using 12 industrial designs, all of them with on-chip EDT-based test compression. They represent different design styles and scan methodologies. The basic data regarding the designs, such as the number of gates, number of scan cells, scan architecture, and the total number of stuck-at faults are listed in FIG. 9. The experimental results show that the disclosed technology can significantly reduce the number of patterns that need to be saved as seeds while preserving the test coverage. Compared to some convention technologies, the disclosed technology requires 2-4 times less stored test patterns.

Figure 10:
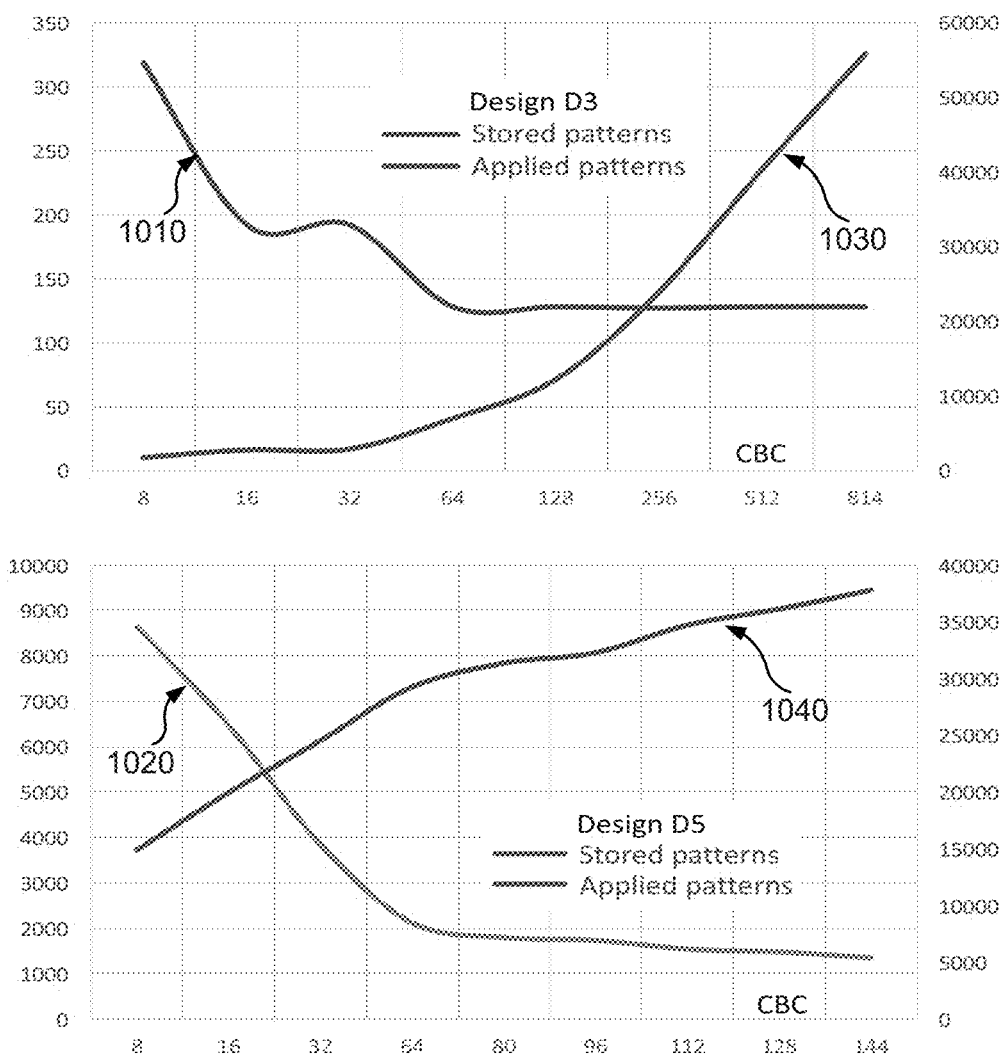
FIG. 10 illustrates, using two of the industry designs of FIG. 9, how the number of parent test patterns to store drops and how the number of patterns to apply rises with the increasing distance between successive complements.

Increasing the value of CBC can potentially increase the number of children patterns due to the increased number of initial offset values. A larger number of children patterns for each parent test pattern will lead to a smaller number of parent test patterns needed and thus the smaller on-chip memories. However, the test time is dependent upon the total number of test patterns (parent & child test patterns). Therefore, an optimal range of CBC values may exist. FIG. 10 illustrates, using two of the industry designs of FIG. 9, how the number of parent test patterns to store (in the form of decompressible seeds) drops, and how the number of patterns to apply (including both parents and their derivatives) rises with the increasing distance between successive complements (represented by the variable CBC). Curves 1010 and 1020 represent stored parent test patterns, whereas curves 1030 and 1040 represent the total test patterns that need to be applied. Both diagrams demonstrate that while increasing the CBC value may lead to reduction of the number of parent patterns (and hence relatively small on-chip test memories), this phenomenon is associated with a visible increase in the number of test patterns that need to be eventually applied, or alternatively in the increased test time. For both of designs D3 and D5, CBC in the range between 32 and 64 may be a good tradeoff.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A system for testing a circuit, comprising:
    scan chains comprising scan cells, the scan chains configured, in a test mode, to shift in test patterns, apply the test patterns to the circuit, capture test responses of the circuit, and shift out the test responses;
    a controller comprising storage circuitry, the controller configured to generate a bit-inverting signal based on child test pattern information stored in the storage circuitry; and
    bit-inverting circuitry coupled to the controller, the bit-inverting circuitry configured to generate a child test pattern by inverting a plurality of bits of a parent test pattern during a shift operation based on the bit-inverting signal, wherein locations of the plurality of bits are associated with a plurality of shift clock cycles for bit inverting, the plurality of shift clock cycles for bit inverting occurring every m shift clock cycles, m representing a distance between successive bit-inverting time frames, and the child test pattern information comprises information of m and location of the plurality of shift clock cycles for bit inverting in the shift operation,
    and wherein the parent test pattern and the location of the plurality of shift clock cycles for bit inverting in the shift operation are determined by a test pattern generation software tool, the test pattern generation software tool performing a pattern generation process comprising: performing a circuit structural analysis first to identify supergates, running an automatic test pattern generation (ATPG) process using the supergates to determine parent test patterns, and generating child test patterns for the parent test patterns.

2. The system recited in claim 1, wherein m is the same for all of child patterns for all of parent test patterns of a test set.

3. The system recited in claim 1, wherein the pattern generation process further comprises: performing pattern reordering, and saving effective child test patterns.

4. The system recited in claim 1, further comprising:
    test pattern decompressing circuitry, test pattern decompressing circuitry configured to decompress compressed parent test pattern into the parent test pattern.

5. The system recited in claim 4, wherein the inverting bits is performed in the test pattern decompressing circuitry.

6. The system recited in claim 4, wherein the test pattern decompressing circuitry comprises a ring generator and a phase shifter.

7. The system recited in claim 6, wherein the inverting bits is performed by XOR gates inserted between the ring generator and the phase shifter.

8. The system recited in claim 1, wherein the storage circuitry comprises a first register for storing information of m and a second register for storing information of location of the plurality of shift clock cycles for bit inverting in the shift operation.

9. The system recited in claim 8, wherein the controller further comprises a down counter, the down counter being coupled to outputs of the second register, and the bit-inverting signal is generated based on combining outputs of the down counter and outputs of the first register.

10. One or more computer-readable media storing computer-executable instructions for causing a computer to perform a method, the method comprising:
    creating a system in a circuit design for testing a circuit fabricated according to the circuit design, the system comprising:
    scan chains comprising scan cells, the scan chains configured, in a test mode, to shift in test patterns, apply the test patterns to the circuit, capture test responses of the circuit, and shift out the test responses;
    a controller comprising storage circuitry, the controller configured to generate a bit-inverting signal based on child test pattern information stored in the storage circuitry; and
    bit-inverting circuitry coupled to the controller, the bit-inverting circuitry configured to generate a child test pattern by inverting a plurality of bits of a parent test pattern during a shift operation based on the bit-inverting signal to, wherein locations of the plurality of bits are associated with a plurality of shift clock cycles for bit inverting, the plurality of shift clock cycles for bit inverting occurring every m shift clock cycles, m representing a distance between successive bit-inverting time frames, and the child test pattern information comprises information of m and location of the plurality of shift clock cycles for bit inverting in the shift operation,
    and wherein the parent test pattern and the location of the plurality of shift clock cycles for bit inverting in the shift operation are determined by a test pattern generation software tool, the test pattern generation software tool performing a pattern generation process comprising: performing a circuit structural analysis first to identify supergates, running an automatic test pattern generation (ATPG) process using the supergates to determine parent test patterns, and generating child test patterns for the parent test patterns.

11. The one or more computer-readable media recited in claim 10, wherein m is the same for all of child patterns for all of parent test patterns of a test set.

12. The one or more computer-readable media recited in claim 10, wherein the pattern generation process further comprises: performing pattern reordering, and saving effective child test patterns.

13. The one or more computer-readable media recited in claim 10, wherein the system further comprises: test pattern decompressing circuitry, test pattern decompressing circuitry configured to decompress compressed parent test pattern into the parent test pattern.

14. The one or more computer-readable media recited in claim 13, wherein the inverting bits is performed in the test pattern decompressing circuitry.

15. The one or more computer-readable media recited in claim 13, wherein the test pattern decompressing circuitry comprises a ring generator and a phase shifter.

16. The one or more computer-readable media recited in claim 15, wherein the inverting bits is performed by XOR gates inserted between the ring generator and the phase shifter.

17. The one or more computer-readable media recited in claim 10, wherein the storage circuitry comprises a first register for storing information of m and a second register for storing information of location of the plurality of shift clock cycles for bit inverting in the shift operation.

18. The one or more computer-readable media recited in claim 17, wherein the controller further comprises a down counter, the down counter being coupled to outputs of the second register, and the bit-inverting signal is generated based on combining outputs of the down counter and outputs of the first register.

* * * * *